(12) United States Patent
Schwartz et al.

(10) Patent No.: US 6,720,899 B2
(45) Date of Patent: Apr. 13, 2004

(54) EXTENDED PRECISION PIXEL

(75) Inventors: David Schwartz, Moorpark, CA (US); David Shu, West Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 09/924,700

(22) Filed: Aug. 7, 2001

(65) Prior Publication Data

US 2003/0030578 A1 Feb. 13, 2003

(51) Int. Cl.[7] .................................................. H03M 1/12
(52) U.S. Cl. ........................................ 341/155; 341/118
(58) Field of Search .............................. 341/155, 118, 341/111, 110, 131

(56) References Cited

U.S. PATENT DOCUMENTS

| | | | |
|---|---|---|---|
| 3,781,872 A | | 12/1973 | Frisch et al. |
| 5,548,286 A | * | 8/1996 | Craven ........................ 332/107 |
| 5,585,796 A | * | 12/1996 | Svensson et al. ........... 341/155 |
| 5,596,323 A | * | 1/1997 | Erhage ........................ 341/111 |
| 5,606,321 A | * | 2/1997 | Suga ........................... 341/155 |
| 5,610,943 A | * | 3/1997 | Kakuishi et al. ............. 341/110 |
| 6,331,831 B1 | * | 12/2001 | Cvetkovic et al. .......... 341/131 |
| 6,340,943 B1 | * | 1/2002 | Chow et al. ................. 341/118 |

FOREIGN PATENT DOCUMENTS

| | | | |
|---|---|---|---|
| EP | 1 233 613 A | | 8/2002 |
| WO | WO 93 14595 A | | 7/1993 |
| WO | WO 00 38409 A | | 6/2000 |

OTHER PUBLICATIONS

Nakamura K. et al. "A CMOS Analog Front–End Chip–Set for Mega Pixel Camcorders" XP010378853, p. 190, IEEE 2000.

1. D. Yang, A El Gamal, B Fowler, H Tan, "A 640×512 CMOS Image senor with ultra wide dynamic range flashing–point pixel–level ADC", 1998 IEEE International solid–state circuits conf., WA 17.5, pp. 308–309, 1998.

2. T Lule, B. Schneider, M. Bohm, "Design and fabrication of a high dynamic range image sensor in TFA technology", IEEE Journal of solid–state circuits, special issue on 1998 symp. On VLSI circuits, 1999.

* cited by examiner

*Primary Examiner*—Jean Jeanglaude
(74) *Attorney, Agent, or Firm*—Tope-McKay & Associates (57) ABSTRACT

A signal is generated at a source 100a and a first portion of the signal 102a is processed locally by a processor 104a. This first portion of the signal 102a that is locally processed, is comprised of data, which would be prone to noise masking or loss, in its transition from the source 100a to a non-local analog-to-digital converter in the absence of a processing step. The remaining portion of the signal 106a is converted at a non-local analog-to-digital converter 108a, to produce a first digital signal 110a. The processed signal 112a is converted non-locally at a non-local converter 114a to produce a second digital signal 116a, finally the first digital signal 100a is combined with the second digital signal 116a to produce a digital output signal 118a.

44 Claims, 9 Drawing Sheets

EXTENDED PRECISION PIXEL

TECHNICAL FIELD

This invention relates generally to signal processing and more specifically to a method and apparatus for increasing the precision and dynamic range of processed signals.

BACKGROUND OF THE INVENTION

There is a demand in many electronics applications for increased precision and dynamic range. This demand for increased precision is especially acute in imaging sensors, particularly in the areas of automotive sensing systems associated smart driving, and certain surveillance applications. Current imaging sensors for CMOS active pixel sensors, are limited to about 12 bits for on chip analog-to-digital converters. Attempts have been made to incorporate analog-to-digital converters within the pixel or quad pixels to exploit the improved local signal-to-noise ratio. These attempts have generally not succeeded in achieving the desired improvement of precision, dynamic range, and signal-to-noise ratio at a chip level. Therefore it would be desirable to provide an improvement of precision, dynamic range, and signal-to-noise ratio.

SUMMARY OF THE INVENTION

The present invention relates generally to improving the performance of analog-to-digital converters. The invention provides a method and apparatus for improving the resolution of analog-to-digital converters by providing a signal from a source and locally processing a first portion of the signal to produce a processed signal. The remaining portion of the signal is non-locally converted to produce a first digital signal. The processed signal is converted non-locally to produce a second digital signal, finally the first digital signal is combined, using either a common analog-to-digital converter or a shared analog-to-digital converter, with the second digital signal to produce a digital output signal.

Another embodiment includes providing a signal from a source and locally converting a first portion of the signal to produce a first digital signal. The remaining portion of the signal is non-locally converted to produce a second digital signal. The first digital signal is combined with the second digital signal to produce a digital output signal using either a common analog-to-digital converter or a shared analog-to-digital converter.

In another embodiment a signal is provided from a source, and a portion of that is processed to produce a processed signal. The remaining portion of the signal is non-locally converted to produce a first digital signal. The processed signal is converted to produce a second digital signal, finally the first digital signal is combined with the second digital signal to produce a digital output signal using either a common analog-to-digital converter or a shared analog-to-digital converter.

In the above embodiments the local processing of the first portion of the signal can be done with a quantizing processor utilizing a waveform generating element that generates a waveform utilizing either an analog circuit configured to generate a waveform or a digital logic circuit and a digital to analog converter configured to generate an analog waveform. In the second embodiment listed above the conversion of the first portion of the signal can be generated with a local analog-to-digital converter. Additionally the signal can be generated at a source such as an electromagnetic radiation sensor where the sensor could be a pixel.

BRIEF DESCRIPTION OF THE DRAWINGS

The objects, features, and advantages of the present invention will be apparent from the following detailed description of the preferred embodiments, taken in conjunction with reference to the following drawings.

FIG. 3a is a schematic depiction of a multi-detector pixel with four detectors;

FIG. 3b is a schematic depiction of an output of the four detectors in FIG. 2a;

FIG. 4b is an illustration showing the use of multiple exposure/integration periods in a timing diagram for the time scaling pixel of FIG. 4a;

DETAILED DESCRIPTION

The present invention provides a method and an apparatus useful for increasing the precision, dynamic range and signal-to-noise ratio of signal processors, and may be tailored to a variety of other applications. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein. Furthermore it should be noted that, unless explicitly stated otherwise, the figures included herein are illustrated diagrammatically and without any specific scale, as they are provided as qualitative illustrations of the concept of the present invention.

Figure 1A:
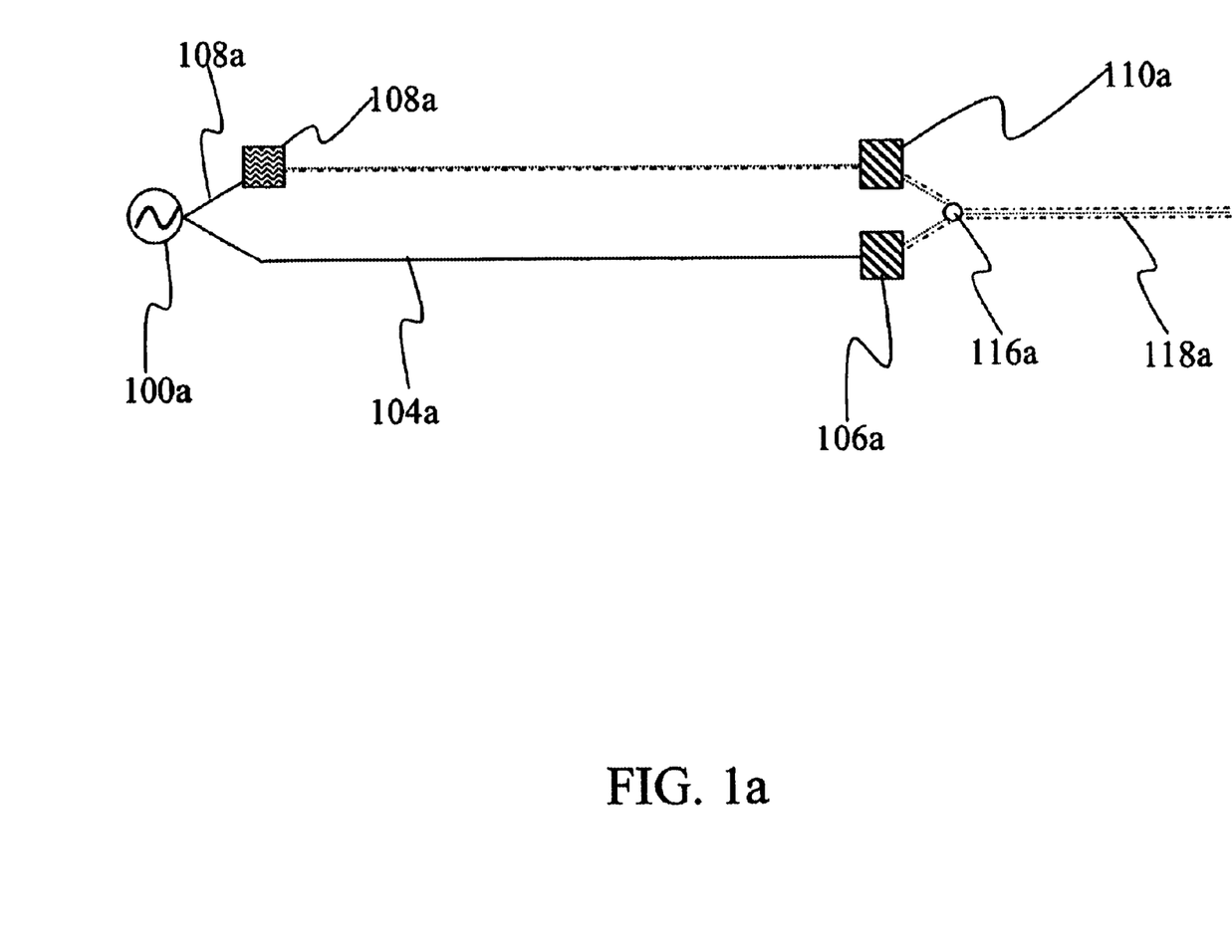
FIG. 1a is a schematic diagram showing one embodiment of the present invention, where a portion of a signal undergoes preprocessing at or near the signal source.

In one embodiment of the present invention, set forth schematically in FIG. 1a, a signal is generated at a source 100a and a first portion of the signal 102a is processed locally by a processor 104a. This first portion of the signal 102a that is locally processed, is comprised of data, which would be prone to noise masking or loss, in its transition from the source 100a to a non-local analog-to-digital converter in the absence of a local processor. The remaining portion of the signal 106a is converted at a non-local analog-to-digital converter 108a, to produce a first digital signal 110a. The processed signal 112a is converted non-locally at a non-local converter 114a to produce a second digital signal 116a, finally the first digital signal 110a is combined with the second digital signal 116a to produce a combined digital output signal 118a, having an improved resolution, dynamic range, and precision. This improvement results from the capture of bits, herein referred to as least significant bits. These bits are usually lost in transition from the source to a non-local analog-to-digital converter. The loss can be the result of noise masking, spurious inputs or a plurality other causes. The local processor can take a number of forms and will be discussed further below. In essence, the local processor performs a quantization operation, wherein the least significant bits are quantized and the quantized data is delivered to a remote analog-to-digital converter.

Figure 1B:
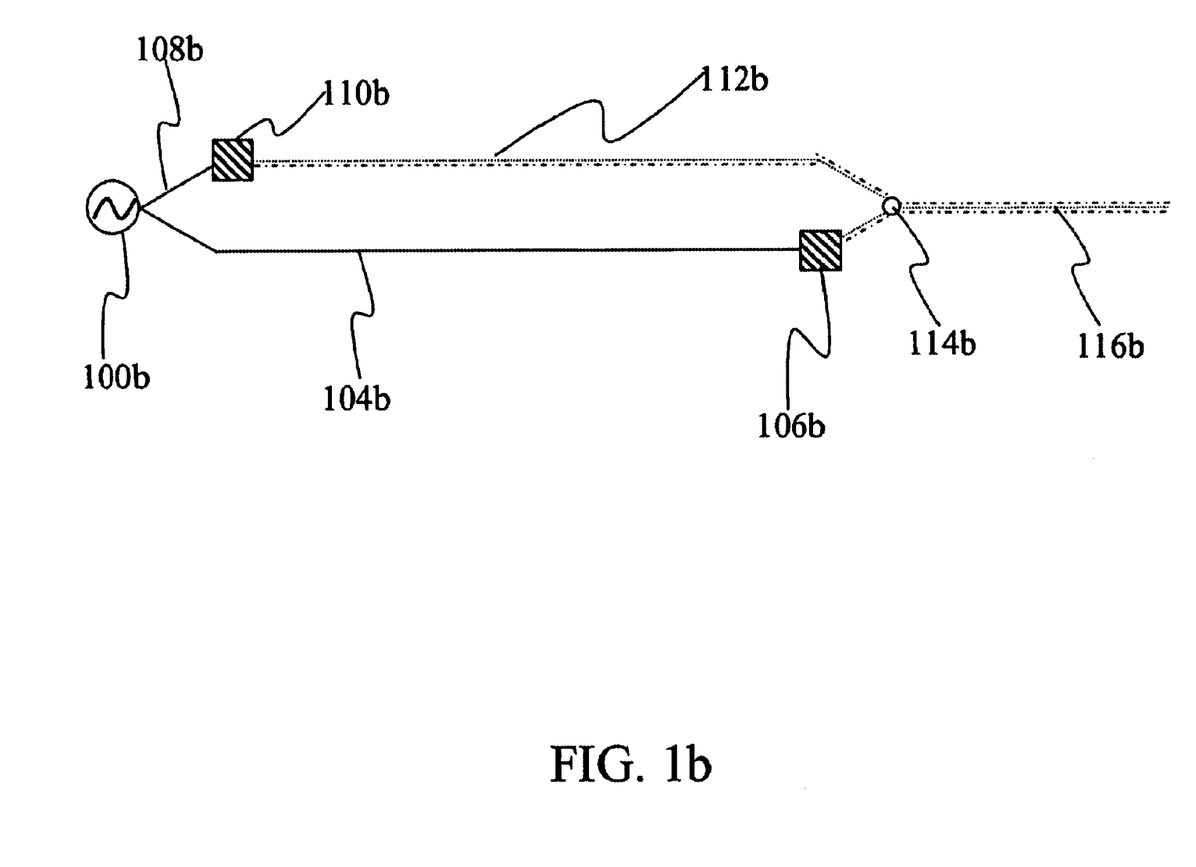
FIG. 1b is a schematic diagram showing another embodiment of the present invention where a portion of a signal undergoes analog-to-digital conversion at or near the signal source.

Another embodiment of the invention, depicted in FIG. 1b, a signal originates at a source 100b and a first portion of the signal 102b utilizes a local converter 104b, to convert the first portion of the signal 102b to produce a first digital signal 106b. The remaining portion of the signal is conveyed to a non-local analog-to-digital converter 108b to produce a second digital signal 110b. The first digital signal 106b is combined with the second digital signal 110b to produce a combined digital output signal 112b. This embodiment differs from the first embodiment in that it includes a local analog-to-digital converter. This local converter converts the least significant bits at or near the source and thus substantially eliminates the possible risk of noise masking and provides a final signal having improved resolution, dynamic range, and precision. Because it has a local analog-to-digital converter this embodiment does not require a quantization operation at the source.

Figure 1C:
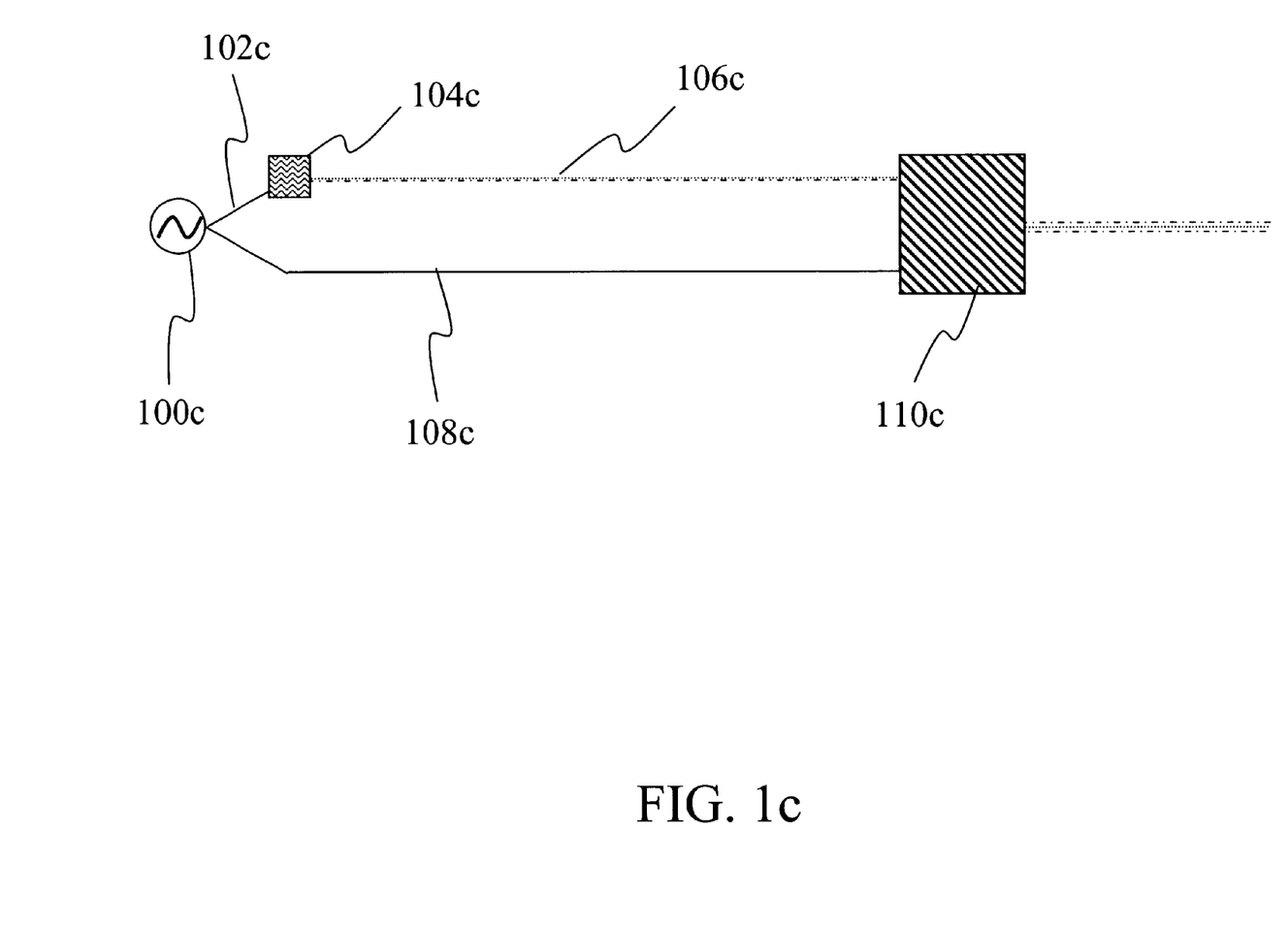
FIG. 1c is a schematic diagram showing another embodiment of the present invention where the preprocessed data and the non-locally processed data is converted in a single analog-to-digital converter.

In another embodiment, shown in FIG. 1c a signal is provided from a source 100c, and a first portion of that signal 102c is processed in a processor 104c to produce a quantized signal 106c. The remaining portion of the signal 108c and the quantized signal 106c are non-locally converted utilizing a shared analog-to-digital converter 110c. As used herein, non-local and near, connote a physical proximity beyond which noise begins to mask meaningful amounts of data. Thus near does not necessarily have a fixed physical value, and as stated above the drawings are not intended to represent scale.

In another embodiment, the invention uses a time waveform with the values of the least significant bits being generated. At the time the most significant bits are captured, the value of the waveform is also captured. This waveform value is substantially the same as that of the least significant bits that are masked by noise in non-local analog-to-digital converters. When these least significant bits are added back to the most significant bits the effective number of bits is increased in a meaningful way.

Figure 2:
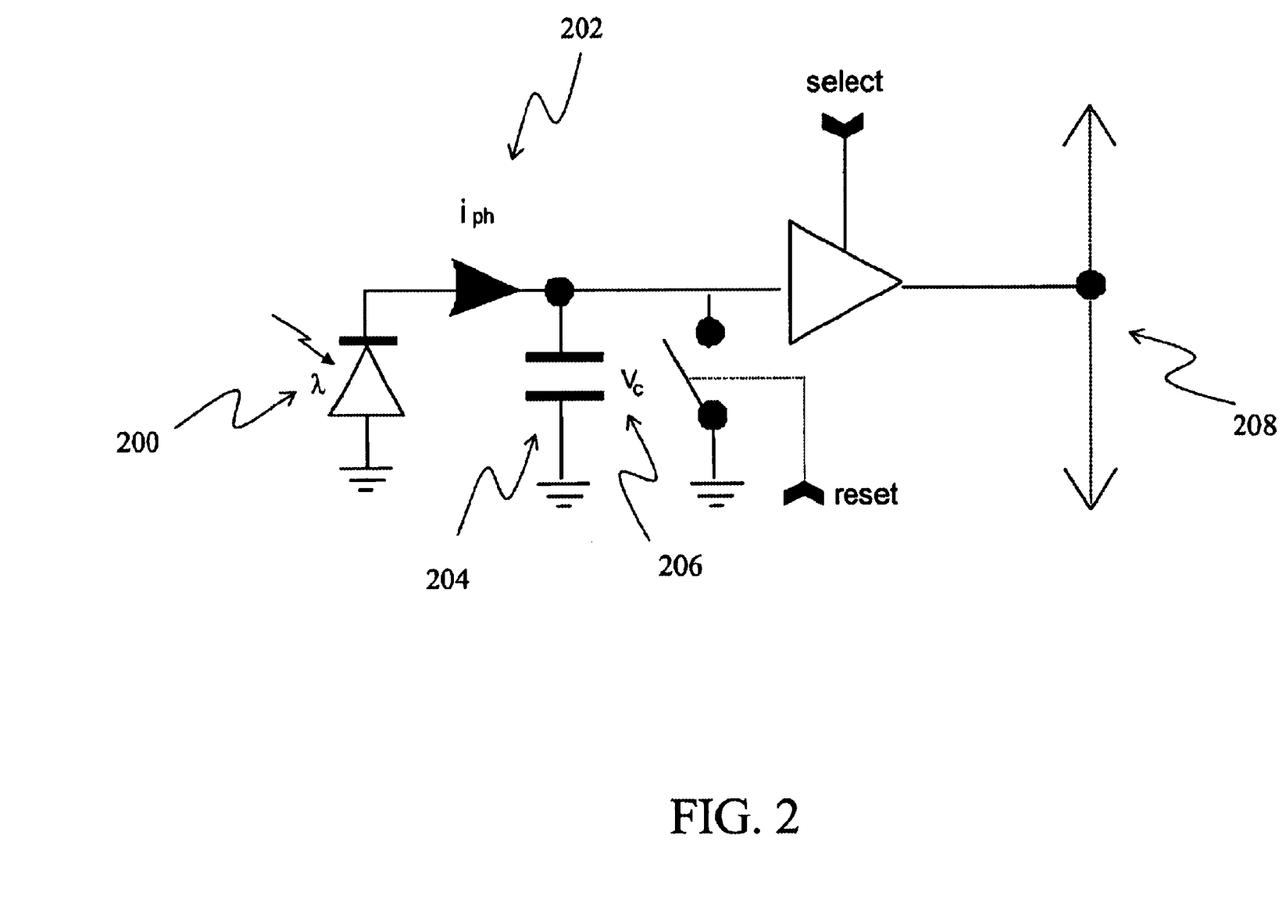
FIG. 2 is a schematic depiction of a conceptual model of a simple pixel.

A conceptual model of a simple pixel, which could serve as a data source, is shown in FIG. 2. The photo-junction 200 generates a photo-current $i_{ph}$, 202, proportional to the illumination that charges a capacitor 206. Assuming that during the exposure interval a constant illumination falls on the photo-junction 200, then the voltage across the capacitor forms a linear ramp. At the end of the exposure period, the voltage in the capacitor 204 is read out onto a column line 208. Typically all the pixels in a given row are enabled onto their respective column lines 208. At the chip level, one or more analog-to-digital converters convert the sampled voltages 204 to the digital values. The voltage on the capacitor 204 is proportional to the intensity of the illumination, the effective area of the photo-junction 200, and the length of the integration period or shutter speed.

Figures 3A, 3B:
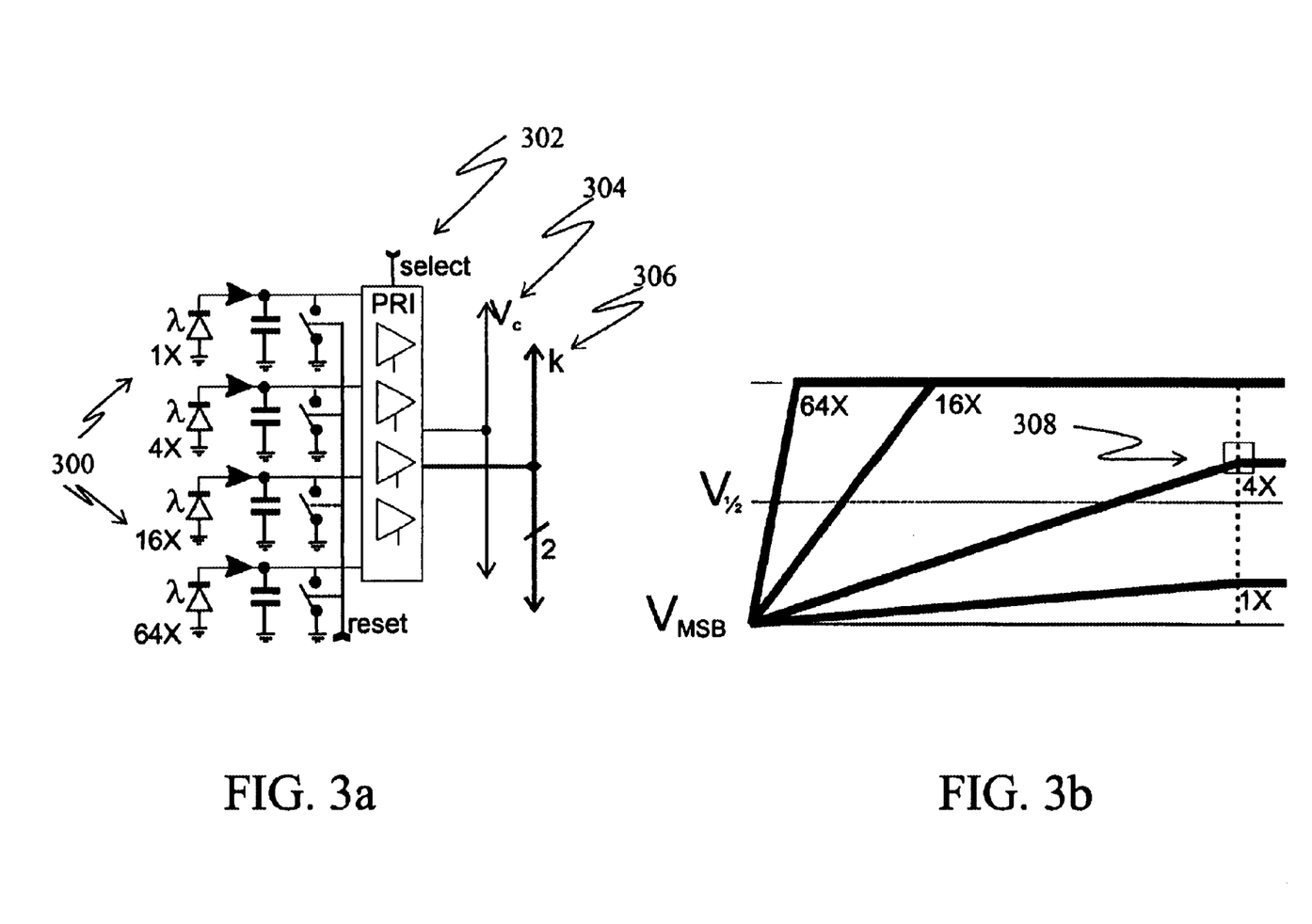

FIG. 3a illustrates a simple method for extending dynamic range and precision. According to this method, multiple detectors 300 are utilized per pixel. FIG. 3a illustrates a multi-detector pixel with four detectors 300 with effective areas of 1×, 4×, 16×, and 64×. This could be any ratio, 4 is used for illustration purposes. A priority encoder 302 selects the largest output below the maximum saturation threshold. $V_c$ 304 is the selected output, and k 306 is a binary encoding of which input was selected. The outputs of the four detectors are shown in FIG. 3b. The output of the 4× 308 detector is the largest non-saturated value at the end of the exposure/integration period, and consequently k=1.

This results in a dynamic range increase of $20\log_{10} 64=36$ dB, and an increase in precision of 2 bits. Similarly using a ratio of 16 instead of 4 would have yielded a 72 dB increase in dynamic range.

Figure 4A:
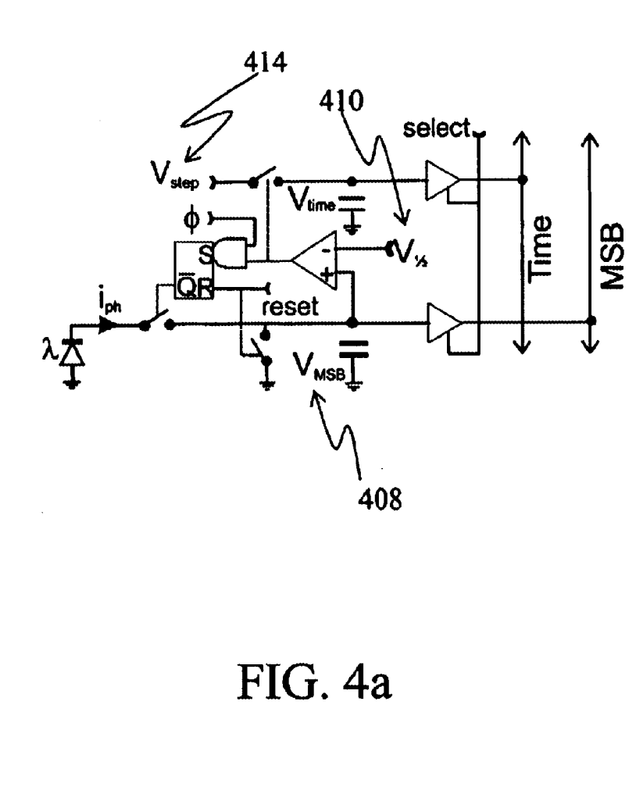
FIG. 4a is a schematic depiction of the use of multiple exposure/integration periods in a time scaling pixel.
Figure 4B:
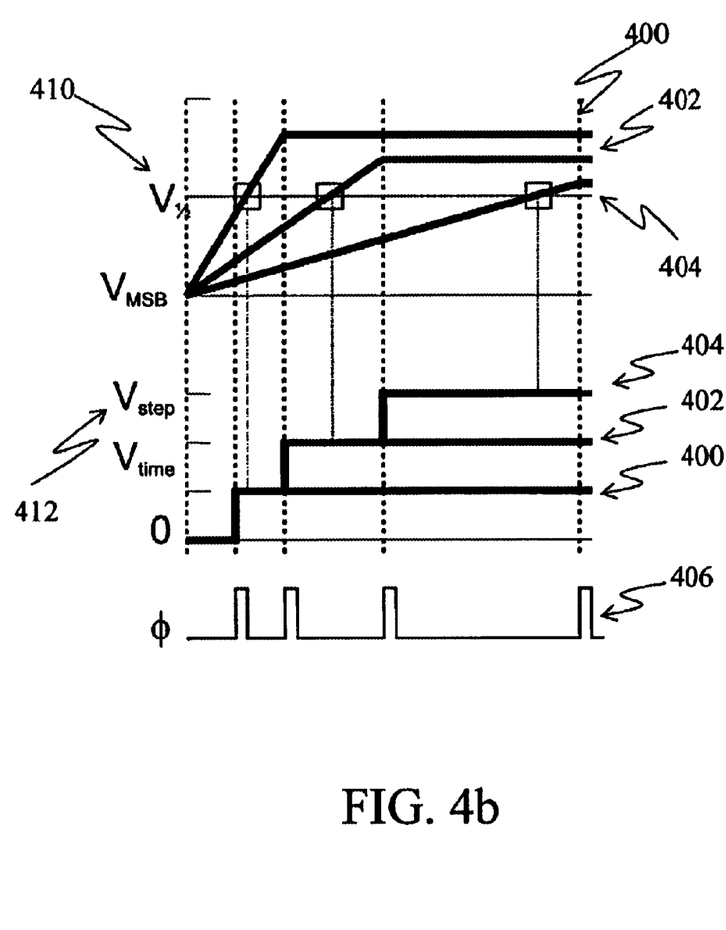

Another method uses multiple exposure/integration periods, instead of using multiple detectors. The illustrations in FIG. 4a and FIG. 4b show such an approach. Curve 1 400, curve 2 402, and curve 3 404 illustrate three different cases. In this example, the exposure periods are 1, 2, 4, and 8 406. The voltage on the capacitor 408 is compared to the reference, $V_{1/2}$, 410 on the rising edge of the clock. If the voltage on the capacitor 408 is below the threshold, the period is extended; otherwise the voltage on the capacitor 408 is sampled and held. The time stamp of the exposure is similarly sampled and held from the $V_{step}$ 412 input.

$$I = 2^k \cdot V_{msb}$$

Where;

I is the illumination, k is the quantized time stamp, $V_{msb}$ is the voltage of the most significant bits.

Clock and $V_{step}$ 412 waveforms based on other radices can be chosen for a larger dynamic range.

For a radix r, and M exposure periods, the dynamic range is extended $20M \log_{10} r$ dB, and precision increased by $\log_2 M$ bits. Time scaling can also be implemented reading out the pixel multiple times, and retaining the largest non-saturated value. This requires a higher speed readout and analog-to-digital conversion, as well as local digital image storage. Improving the signal-to-noise ratio also improves dynamic range and precision.

One embodiment of the present invention provides a method and apparatus for increasing precision, and or dynamic range of processed signals. This is accomplished by separating the collected data, at the source, into at least two signal groups. A first group, which includes bits that are above the noise level, is delivered to a non-local processor where the signal is converted. The second signal group or groups are processed relatively locally or at the source. For the purposes of clarity the second signal group will be said to be processed locally, where locally is understood to mean both at the source and the general vicinity of the source. Further the second signal group is herein referred to in the singular, again for the purposes of clarity, however the second signal group, which is processed locally could be more than one signal and could be processed at more than one different local site. Local processing may include a quantization step wherein the second signal group has its analog values quantized and then the quantized values are transmitted to a non-local processor where the bits can be converted. The quantized values may be combined with the first group and thereby increase the effective number of bits provided to an analog-to-digital converter.

For the purposes of this disclosure, least significant bits, refers to bits that are below the noise at a non-local signal processing site. A non-local signal processing site might occur at the chip level while the source of the signal is generated at an electromagnetic radiation sensor such as a pixel or element in an antenna array.

In some situations, the collected data, which has been separated at the source is said to be comprised of most significant bits and least significant bits. The least significant bits are captured as a quantized analog value, locally, and are converted to digital bits using a non-local analog-to-digital converter. The least significant bits are added to the most significant bits, which are processed non-locally, thereby increasing the effective number of captured bits. The increase is the result of the addition of the least significant bits that would have been lost using conventional non-local processing. The least significant bits are lost using conventional systems because the least significant bits are below the noise level at the non-local processing site. Thus processing the least significant bits locally results in an increased signal-to-noise ratio. Increasing the signal-to-noise ratio is difficult when a distributed analog signal is used, however an equivalent amount of timing resolution is relatively easy. Thus locally quantizing the least significant bits has the effect improving the signal-to-noise ratio.

Figures 5A, 5B:
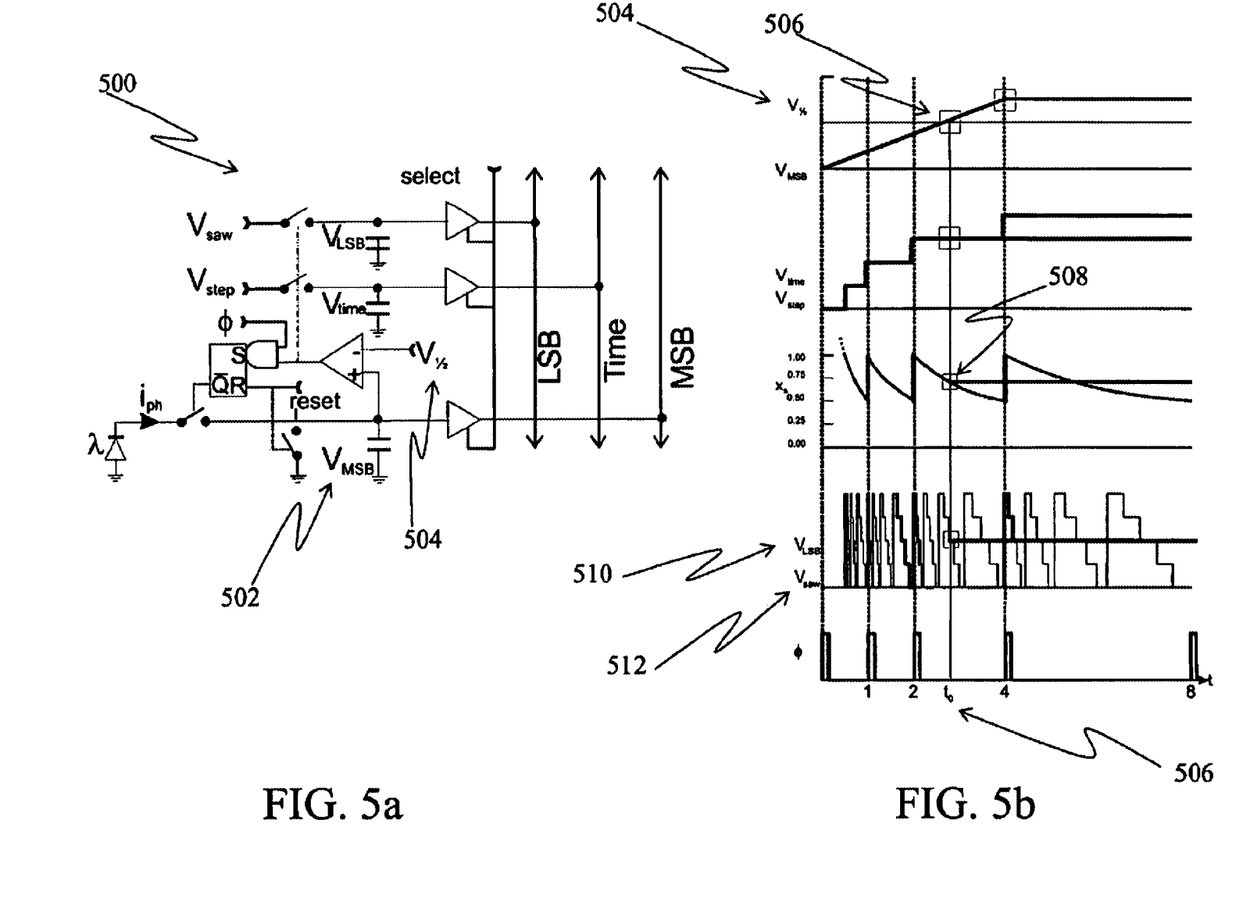
FIG. 5a is a schematic depiction of the concept of the invention.
FIG. 5b is a graphical representation substantially illustrating the timing diagram of one embodiment of the invention.

The illustration set forth in FIG. 5a substantially illustrates one embodiment the invention. It is shown as a modification to the time scaling pixel of FIG. 4a. However, the concept can be applied to any signal source or pixel with analog readout. The comparator requires an increased gain-bandwidth product to meet the required settling time and signal-to-noise ratio.

The least significant bit, as the term is used herein, is the analog capture of the of bits that are below the noise level of the system. The most significant bits are the sampled and held scaled output. Except for the final period it is always between ½ and 1. Referring to FIG. 5b; if the integrated photo-current produces a voltage $V_{MSB}$ 502 equal to $V_{1/2+1}$, 504 at time $t_0$, 506 then the captured and held output of the most significant bits, at the end of the period, is equal to the conceptual signal $X_s(t_0)$ 508. There is a reciprocal relationship between $X_s$ and $t_0$.

Normalizing the time scale, the exposure/integration periods are (½–1], (1–2], (2–4], and (4–8]. Normalize the scaled illumination signal, $X_s$, to be in the interval [½–1). For the last period, if $V_{MSB}$ 502 does not exceed $V_{1/2+1}$ 504 then $X_s$ is not in the interval.

$$X_s = \frac{2^{\lfloor \log_2 t \rfloor}}{t}$$

Where
$X_s$—is the scaled illumination signal,
t—is time.

Assume a chip level analog-to-digital conversion of N bits, and a pixel level capture of the least significant M bits, for a total conversion of N+M bits. Let $X=2^{M+N} X_s$. The residual of X modulo $2^M$, a real number, can be computed. Taking the integer part, the M least significant bits of X result.

$$LSB = \lfloor (2^{M+N} X_s) \mod 2^M \rfloor$$

Where;
LSB—is the least significant bit;

M—is the number of bits below those captured by chip level analog-to-digital converters;
N—is the number of bits captured by chip level analog-to-digital converters;
$X_s$—is the scaled illumination signal;

$$x \mod y \equiv x - y \cdot \left\lfloor \frac{x}{y} \right\rfloor, y \neq 0.$$

Therefore, the waveform $V_{saw}$ 512 can be generated $$V_{saw}(t) = \left\lfloor \left( 2^{M+N} \cdot \frac{2^{\lfloor \log_2 t \rfloor}}{t} \right) \mod 2^M \right\rfloor$$

Where;
$V_{saw}$—is the generated waveform;
M—is the number of bits below those captured by chip level analog-to-digital converters;
N—is the number of bits captured by chip level analog-to-digital converters;
t—is the time of bit capture.

The waveform $V_{saw}$ is held and captured as $V_{LSB}$ 510 at the time of comparator equality, then $V_{LSB}$ 510 is the analog encoding of the least significant bits and can be easily converted by a chip level M bit analog-to-digital converter.

Figure 5C:
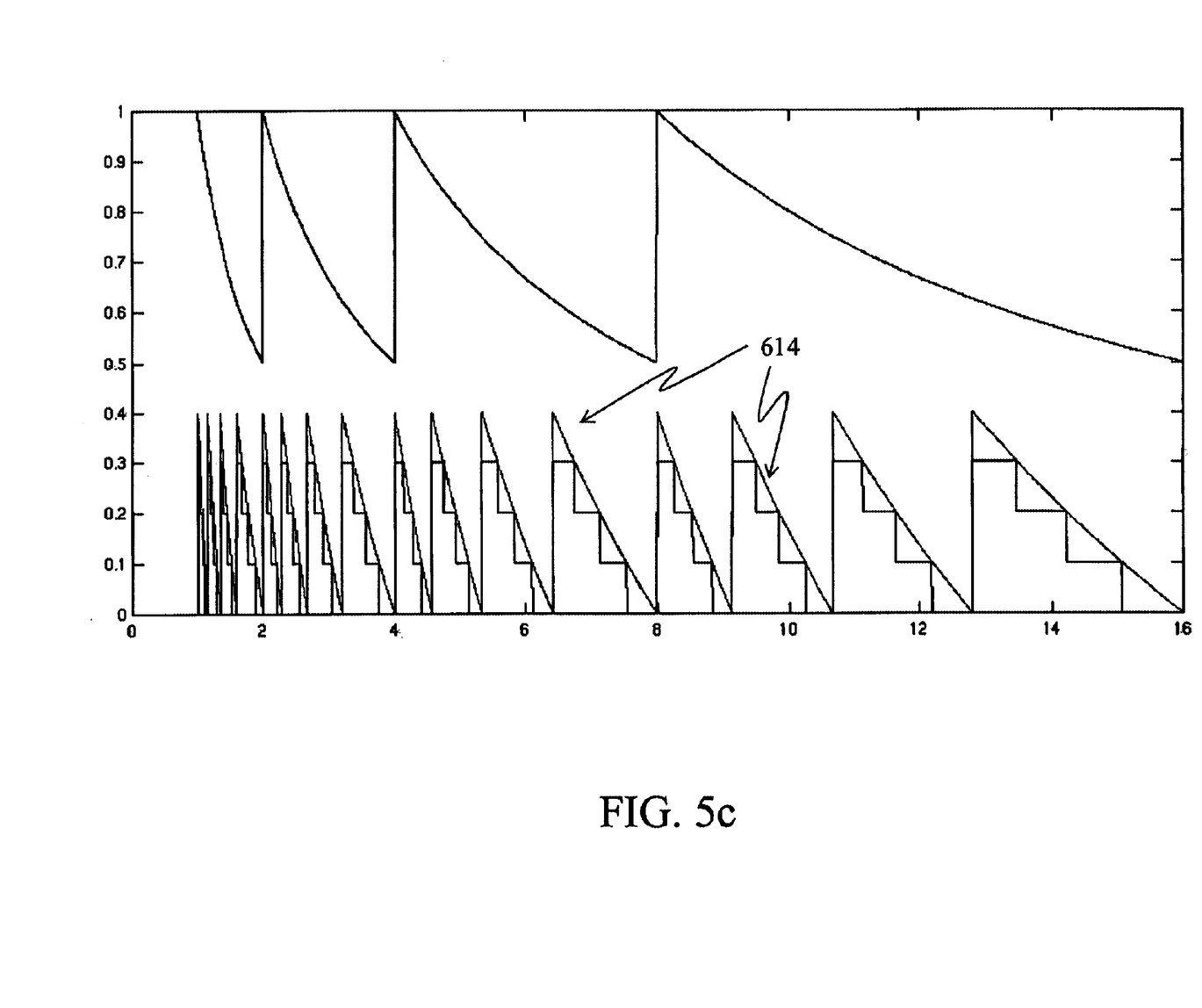
FIG. 5c is a graphical representation substantially illustrating a magnified portion of the timing diagram of the invention.

$V_{saw}$ 512 can be generated by a digital to analog converter and a ROM, or combination of a ROM and clock generator. While shown as a hyperbolic sawtooth like structure, it should be understood that it is not necessary to quantize the steps in this way, or even to quantize the steps at all. A curve 514, as shown in FIG. 5c or other shape can also be used, and may be desirable if an analog waveform generation method is used.

Combining the three signals, the illumination is:

$$I = 2^k \cdot (2^M V_{msb} + V_{LSB})$$

Where;
I—is the illumination,
k—is the quantized time stamp,
$V_{msb}$—is the voltage of the most significant bits,
$V_{LSB}$—is the voltage of the least significant bits,
Dynamic range can also be extended by non-linear compression.

The precision and dynamic range of pixels can now be increased by generating a voltage substantially correlating to the value of the bits lost by the chip level analog-to-digital converters. The voltage is being generated as an analog value, and chip level analog-to-digital conversion is used to convert the value to digital bits. Once the value is converted to digital bits it is added to the most significant bits. This addition of least significant bits and most significant bits results in a substantial improvement in the precision and dynamic range of pixels.

Figure 6:
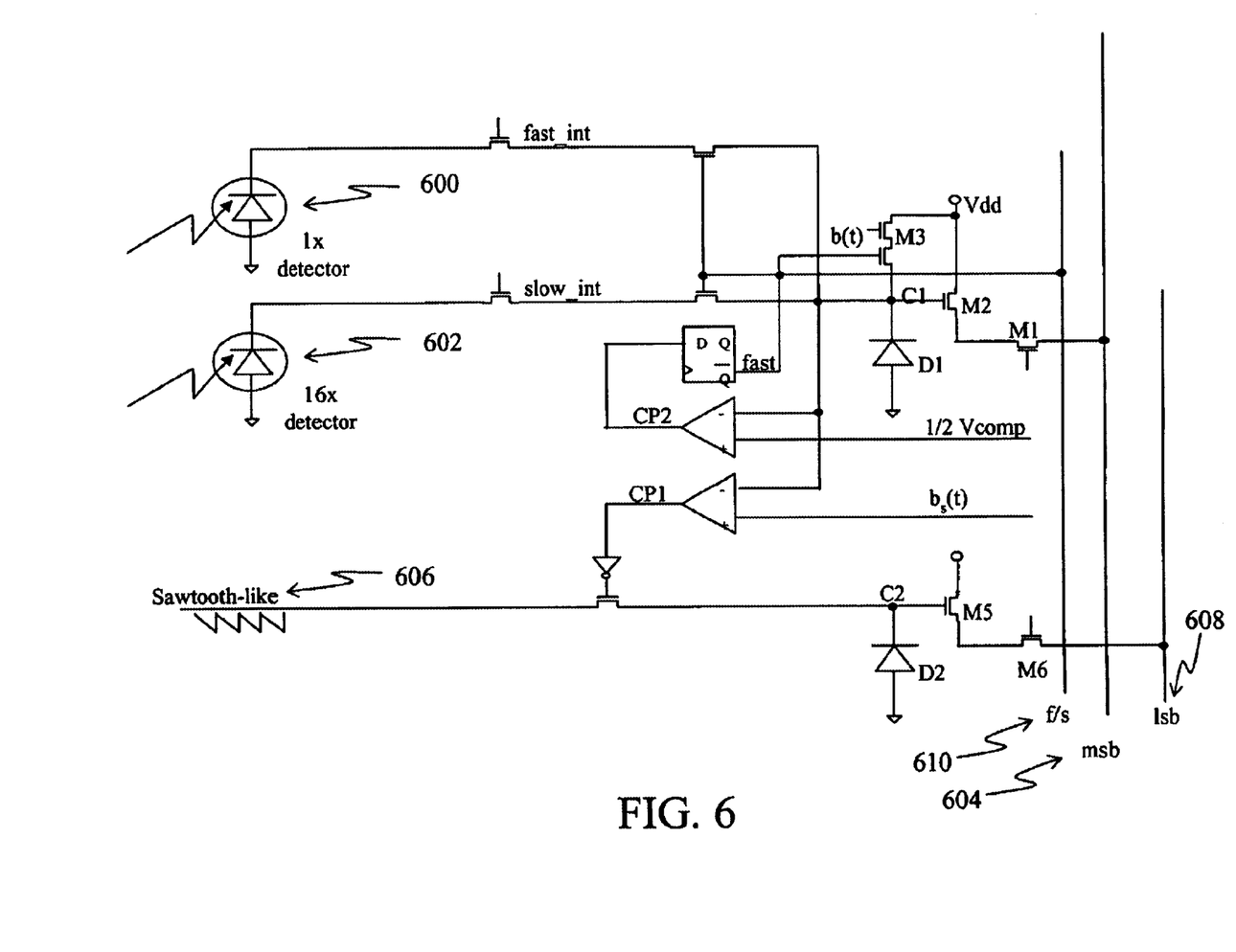
FIG. 6 is a schematic depiction of a hybrid pixel.

All of the methods described here can also be directly applied to logarithmic active pixel circuits. An example of how multi-detector pixels can be used with logarithmic compression and still achieve extended precision is shown in FIG. 6. The example uses:
i. two detectors that differ in effective area by 16×;
ii. logarithmic compression;
iii. extended precision via the sawtooth like waveform.

The hybrid pixel in FIG. 6 yields a two region logarithmic response, with extended precision, and uses two detectors, a 1× detector 600, and a 16× detector 602. Whenever a detector value 604 is collected the correlating sawtooth value 608 is also collected, and the detector that the value was collected from is recorded 610. Next the detector value 604 and the sawtooth value 606 are converted to a chip level analog-to-digital converter. The resultant bit values can then be added together to increase the precision and dynamic range of the pixels.

What is claimed is:

1. A method for improving the resolution of analog-to-digital converters comprising the steps of:
   a. providing a signal from a source, wherein the signal has a first portion and a remaining portion;
   b. locally processing the first portion of the signal to produce a processed signal;
   c. non-locally converting the remaining portion of the signal to produce a first digital signal;
   d. non-locally converting the first processed signal to produce a second digital signal; and
   e. combining the first digital signal with the second digital signal.

2. The method as set forth in claim 1 wherein the first digital signal is comprised of most significant bits and the second digital signal is comprised of least significant bits.

3. The method as set forth in claim 1 wherein the local processing of the first portion of the signal comprises the following steps:
   a. generating an accurate waveform with a waveform generating element; and
   b. utilizing the accurate waveform to quantize the first portion of the signal.

4. The method as set forth in claim 1 wherein the local processing of the first portion of the signal utilizes a waveform generating element that generates a waveform utilizing at least one of the following:
   a. an analog circuit configured to generate a waveform;
   b. a digital logic circuit and a digital to analog converter configured to generate a waveform.

5. The method as set forth in claim 4 wherein the waveform generating element generates a waveform characterized by a hyperbolically curved sawtooth.

6. The method as set forth in claim 5 wherein the local processing of the first portion of the signal is achieved using a waveform, where the waveform encodes the first portion of the signal using a reciprocal.

7. The method as set forth in claim 1 wherein the non-local converting of the first processed signal is done with an analog-to-digital converter.

8. The method as set forth in claim 1 wherein the non-local conversion of the remaining portion of the signal is achieved with an analog-to-digital converter.

9. The method as set forth in claim 1 wherein the signal is generated at a source comprising an electromagnetic radiation sensor.

10. The method as set forth in claim 9 wherein the electromagnetic radiation sensor is a pixel.

11. A method for improving the resolution of analog-to-digital converters comprising the steps of:
    a. providing a signal from a source, wherein the signal has a first portion and a remaining portion;
    b. locally converting a first portion of the signal to a first digital signal using a first analog-to-digital converter;
    c. non-locally converting the remaining portion of the signal to a second digital signal using a second analog-to-digital converter;
    d. combining the first digital signal with the second digital signal to produce a digital output signal.

12. The method as set forth in claim 11 wherein the first digital signal is comprised of least significant bits and the second digital signal is comprised of most significant bits.

13. The method as set forth in claim 11 wherein the signal is generated at a source comprising an electromagnetic radiation sensor.

14. The method as set forth in claim 13 wherein the electromagnetic radiation sensor is a pixel.

15. A method for improving the resolution of analog-to-digital converters comprising the steps of:
    a. providing a signal from a source;
    b. locally processing the first portion of the signal to produce a processed signal;
    c. non-locally converting the processed signal and the remaining portion of the signal to produce a digital output signal utilizing at least one of the following:
       i. a common analog-to-digital converter;
       ii. a shared analog-to-digital converter.

16. The method as set forth in claim 15 wherein the local processing of the first portion of the signal comprises the following steps:
    a. generating an accurate waveform with a waveform generating element;
    b. utilizing the accurate waveform to quantize the first portion of the signal.

17. The method as set forth in claim 15 wherein a waveform generating element generates a waveform utilizing at least one of the following:
    a. an analog circuit configured to generate a waveform;
    b. a digital logic circuit and a digital to analog converter configured to generate a waveform.

18. The method as set forth in claim 17 wherein the waveform generating element generates a waveform characterized by a hyperbolically curved sawtooth.

19. The method as set forth in claim 18 wherein the local processing of the first portion of the signal is processed using a waveform, where the waveform encodes the first portion of the signal using a reciprocal.

20. The method as set forth in claim 15 wherein the non-local conversion and combination of the processed signal and the remaining portion the signal are accomplished with an analog-to-digital converter and a combining element.

21. The method as set forth in claim 15 wherein the signal is generated at a source comprising an electromagnetic radiation sensor.

22. The method as set forth in claim 21 wherein the electromagnetic radiation sensor is a pixel.

23. An apparatus configured to improve the resolution of analog-to-digital converters comprising:
    a. a signal source having a first portion and a remaining portion;
    b. a first processing element configured to locally process the first portion of the signal to produce a processed signal;
    c. a converting element configured to non-locally convert the remaining portion of the signal to produce a first digital signal;
    d. a second converting element configured to non-locally convert the processed signal to produce a second digital signal; and
    e. a combining element configured to combine the first digital signal with the second digital signal.

24. The apparatus as set forth in claim 23 wherein the first digital signal is comprised of most significant bits and the second digital signal is comprised of least significant bits.

25. The apparatus as set forth in claim 23 wherein the element configured to locally process the first portion of the signal comprises a waveform generating element configured to generate an accurate waveform.

26. The apparatus as set forth in claim 25 wherein the waveform generating element comprises at least one of the following:
   a. an analog circuit configured to generate a waveform;
   b. a digital logic circuit and a digital to analog converter configured to generate a waveform.

27. The apparatus as set forth in claim 25 wherein the waveform generating element generates a waveform characterized by a hyperbolically curved sawtooth.

28. The apparatus as set forth in claim 27 wherein the local processing of the first portion of the signal is achieved using a waveform, where the waveform encodes the first portion of the signal using a reciprocal.

29. The apparatus as set forth in claim 23 wherein the non-local converting of the processed signal is achieved with an analog-to-digital converter.

30. The apparatus as set forth in claim 23 wherein the non-local converting of the remaining portion of the signal is achieved with an analog-to-digital converter.

31. The apparatus as set forth in claim 23 wherein the signal is generated at a source comprising an electromagnetic radiation sensor.

32. The apparatus as set forth in claim 31 wherein the electromagnetic radiation sensor is a pixel.

33. An apparatus configured to improve the resolution of analog-to-digital converters comprising:
   a. a signal source having a first portion and a remaining portion;
   b. a first converting element configured to locally convert the first portion of the signal to produce a first digital signal;
   c. a second converting element configured to non-locally convert the remaining portion of the signal to produce a second digital signal; and
   d. a combining element configured to combine the first digital signal with the second digital signal to produce a digital output signal.

34. The apparatus as set forth in claim 33 wherein the first digital signal is comprised of least significant bits and the second digital signal is comprised of most significant bits.

35. The apparatus as set forth in claim 33 wherein the signal is generated at a source comprising an electromagnetic radiation sensor.

36. The apparatus as set forth in claim 35 wherein the electromagnetic radiation sensor is a pixel.

37. An apparatus configured to improve the resolution of analog-to-digital converters comprising:
   a. a signal source having a first portion and a remaining portion;
   b. a first processing element configured to locally process the first portion of the signal to produce a processed signal;
   c. a combining and processing element configured to non-locally combine and process the processed signal and the remaining portion of the signal to produce a digital output signal utilizing at least one of the following:
      i. a common analog-to-digital converter;
      ii. a shared analog-to-digital converter.

38. The apparatus as set forth in claim 37 wherein the element configured to locally process the first portion of data comprises a waveform generating element configured to generate an accurate waveform.

39. The apparatus as set forth in claim 38 wherein the waveform generating element comprises at least one of the following:
   a. an analog circuit configured to generate a waveform;
   b. a digital logic circuit and a digital to analog converter configured to generate a waveform.

40. The apparatus as set forth in claim 38 wherein the waveform generating element generates a waveform characterized by a hyperbolically curved sawtooth.

41. The apparatus as set forth in claim 40 wherein the local processing of the first portion of the signal is processed using a waveform, where the waveform encodes the first portion of the data using a reciprocal.

42. The apparatus as set forth in claim 37 wherein the non-local conversion and combining of the processed signal and the remaining portion the signal are accomplished with an analog-to-digital converter and a combining element.

43. The apparatus as set forth in claim 37 wherein the signal is generated at a source comprising an electromagnetic radiation sensor.

44. The apparatus as set forth in claim 43 wherein the electromagnetic radiation sensor is a pixel.

* * * * *